United States Patent
Spick et al.

(10) Patent No.: US 10,647,290 B2
(45) Date of Patent: May 12, 2020

(54) METHOD FOR ACTIVATING A VEHICLE FUNCTION FROM A PORTABLE ACCESS DEVICE AND ASSOCIATED ACTIVATION MODULE

(71) Applicants: Continental Automotive France, Toulouse (FR); Continental Automotive GmbH, Hannover (DE)

(72) Inventors: Gabriel Spick, Toulouse (FR); Yannis Escalante, Toulouse (FR); Vincent Marimoutou, Toulouse (FR)

(73) Assignees: Continental Automotive France (FR); Continental Automotive GmbH (DE)

( * ) Notice: Subject to any disclaimer, the term of this patent is extended or adjusted under 35 U.S.C. 154(b) by 0 days.

(21) Appl. No.: 16/482,335

(22) PCT Filed: Apr. 9, 2018

(86) PCT No.: PCT/FR2018/050876
§ 371 (c)(1),
(2) Date: Jul. 31, 2019

(87) PCT Pub. No.: WO2018/197771
PCT Pub. Date: Nov. 1, 2018

(65) Prior Publication Data
US 2020/0047712 A1    Feb. 13, 2020

(30) Foreign Application Priority Data

Apr. 25, 2017   (FR) ..................................... 17 53581

(51) Int. Cl.
*G01L 1/14*     (2006.01)
*B60R 25/01*    (2013.01)
(Continued)

(52) U.S. Cl.
CPC ............... *B60R 25/01* (2013.01); *G01L 1/14* (2013.01); *H03K 17/9545* (2013.01);
(Continued)

(58) Field of Classification Search
CPC ..... B60R 25/01; B60R 2325/103; G01L 1/14; H03K 17/9545; H03K 17/97;
(Continued)

(56) References Cited

U.S. PATENT DOCUMENTS 8,454,062 B2 * 6/2013 Rohlfing ................. E05B 81/78
    292/336.3
9,848,775 B2 * 12/2017 Tee ....................... A61B 5/0002
(Continued)

FOREIGN PATENT DOCUMENTS

DE    102013102701 A1    9/2014
EP       3054069 A1      8/2016
(Continued)

OTHER PUBLICATIONS

International Search Report and Written Opinion for International Application No. PCT/FR2018/050876, dated Jul. 25, 2018—7 pages.
(Continued)

*Primary Examiner* — Nay Tun
(74) *Attorney, Agent, or Firm* — RatnerPrestia

(57) ABSTRACT

An activation module, intended to be fitted to a motor vehicle for the purpose of activating a function of the vehicle from a portable access device carried by a user, the module including: a single coil; a first controller for a device for detecting pressure from the hand of the user; a second controller for a near-field communication device; a selector, connected to the single coil, having two positions: a first position in which the selector connects the single coil to the first controller in order to constitute the pressure detection device; a second position in which the selector connects the
(Continued)

single coil to the second controller in order to constitute the near-field communication device; a target having a void, the target being located facing the single coil; an impedance-adjuster that is connected to the target; and a controller for the selector.

13 Claims, 5 Drawing Sheets

(51) Int. Cl.
    *H03K 17/95*     (2006.01)
    *H03K 17/97*     (2006.01)
    *H04B 5/00*     (2006.01)

(52) U.S. Cl.
    CPC ........... *H03K 17/97* (2013.01); *H04B 5/0081* (2013.01); *B60R 2325/103* (2013.01); *H03K 2017/9706* (2013.01); *H03K 2217/9651* (2013.01)

(58) Field of Classification Search
    CPC ... H03K 2017/9706; H03K 2217/9651; H04B 5/0081
    See application file for complete search history.

(56) References Cited

U.S. PATENT DOCUMENTS

| | | | |
|---|---|---|---|
| 9,995,065 B2* | 6/2018 | Witte | E05B 81/64 |
| 10,428,562 B2* | 10/2019 | Guibbert | E05B 81/88 |
| 2002/0125994 A1* | 9/2002 | Sandau | E05B 81/78 |
| | | | 340/5.62 |
| 2003/0029210 A1* | 2/2003 | Budzynski | E05B 85/10 |
| | | | 70/278.1 |
| 2009/0319212 A1* | 12/2009 | Cech | B60R 21/0136 |
| | | | 702/65 |
| 2016/0230429 A1 | 8/2016 | Witte et al. | |
| 2017/0016255 A1 | 1/2017 | Guibbert et al. | |

FOREIGN PATENT DOCUMENTS

| | | |
|---|---|---|
| FR | 2998235 A1 | 5/2014 |
| FR | 3038642 A1 | 1/2017 |
| WO | 2014146949 A1 | 9/2014 |

OTHER PUBLICATIONS

English Translation of the Written Opinion for International Application No. PCT/FR2018/050876, dated Jul. 25, 2018, 5 pages.

* cited by examiner

METHOD FOR ACTIVATING A VEHICLE FUNCTION FROM A PORTABLE ACCESS DEVICE AND ASSOCIATED ACTIVATION MODULE

CROSS REFERENCE TO RELATED APPLICATIONS

This application is the U.S. National Phase Application of PCT International Application No. PCT/FR2018/050876, filed Apr. 9, 2018, which claims priority to French Patent Application No. 1753581, filed Apr. 25, 2017, the contents of such applications being incorporated by reference herein.

FIELD OF THE INVENTION

The present invention pertains to the automotive field and relates more particularly to a method for activating a function of a motor vehicle. The invention applies in particular to the function of locking and unlocking the doors of a motor vehicle.

BACKGROUND OF THE INVENTION

In a motor vehicle, it is known practice to use presence detection devices for detecting the presence of a hand or of a foot of a user of the vehicle and thus to allow all or some of the doors of the vehicle, for example the passenger doors or the trunk, to be locked or unlocked. By way of example, the detection of the presence of a hand of a user on or in front of a door handle in conjunction with the recognition of an identifier of a "hands-free" access device carried by this user allows these doors to be locked and unlocked.

To achieve this, when the user approaches the vehicle, communication is established over a wireless communication link between the access device, for example an electronic badge or a cell phone, and the detection device in order to authenticate said access device by means of its identifier.

To this end, the detection device includes an antenna allowing the identifier transmitted by the access device to be received. The detection device is connected to the vehicle's electronic computer (ECU: abbreviation for "electronic control unit") to which it transmits the identifier.

According to the prior art, the access device is generally an electronic badge. The signal received by the antenna of the detection device, comprising the identifier of the access device, is transmitted via RF (radiofrequency) or LF (low-frequency) waves.

Nowadays, however, it is increasingly common to use a cell phone to perform authentication functions, which makes it possible to avoid using a dedicated electronic badge and thus to limit the number of devices. Since the majority of cell phones do not have RF or LF communication means, it is known practice to use the near-field communication, or NFC, module, with which the majority of modern phones are provided, to transmit the identifier of the device in the case of a function of unlocking a vehicle.

The access device coming into proximity of (less than 10 cm away from) the detection device and the identifier received by the computer being recognized, in conjunction with the hand of the user being detected, allows the door to be locked or unlocked.

To detect the presence of the hand of the user and to allow the doors of the vehicle to be unlocked, such a detection device comprises, in a known manner, a capacitive sensor. Generally, a capacitive sensor is dedicated to one detection zone and, according to the prior art, there is one capacitive sensor for the unlocking zone and one capacitive sensor for the locking zone, the two zones being distinct.

According to one example of capacitive measurement, such a capacitive sensor comprises a first capacitor that is charged and discharged periodically from/into a second capacitor. When the first capacitor discharges into the second capacitor, the charges are balanced between the two capacitors.

When a hand is present on the handle or close to the handle, for example less than 10 mm away, the level of charge of the first capacitor increases. This results in a larger discharge of the first capacitor into the second capacitor, and therefore a higher level of balancing in the presence than in the absence of a hand on the handle. Such a sensor thus makes it possible to detect the intention of the user to unlock the doors of the vehicle.

However, using capacitive sensors has a number of drawbacks.

Specifically, the detection of the approach of a user by capacitive sensors is not robust and generates false detections.

In particular, in some environmental conditions, when the ambient air is humid or when there is salt on the roads, which is spattered onto the metal bodywork of the vehicle, capacitive coupling is created between the detection zones and the metal parts of the vehicle, thereby preventing any detection of the presence of a user by the capacitive sensors.

In addition, raindrops or snowflakes on the door handle increase the capacitance measured by the capacitive sensors, thus triggering false detections.

Lastly, detection by capacitive sensors is incompatible with handles coated with metallic paints or comprising chromed surfaces, the presence of metal in the handle creating a coupling with the detection zones and inhibiting the detection of the presence of a user.

While, for some vehicles, false detections are not desirable, for other vehicles, false detections are not tolerable.

This is the case for vehicles fitted with deployable handles, i.e. the case of handles for which the detection of the presence of the user controls the movement of a motorized handle which, when at rest, is completely incorporated within the door and, when activated, is deployed out of the door. For this type of handle, the unwanted deployment or retraction of the handle due to a false detection by the capacitive sensors risks hitting or squeezing the hand of the user.

This is also the case for vehicles provided with electrically assisted opening, for which the detection of unlocking is accompanied not only by the door being unlocked but also by it opening. In this case, false detections result in unwanted openings of the door.

Lastly, false detections are not tolerable for vehicles provided with the "safe lock" security function, for which the detection of locking controls not only the locking of the vehicle from the outside but also the locking of the vehicle from the inside (anti-theft device). In this case, false detections may lead to the user being shut inside the vehicle.

To overcome these drawbacks, it is known practice in the prior art to replace at least one of the capacitive sensors, for example the capacitive sensor dedicated to locking the vehicle, with a pressure detection sensor, for example an inductive sensor comprising a metal target which moves toward a coil of the sensor when the user presses on the locking or unlocking zone. The variation in inductance of the coil of the inductive sensor, due to the target approaching the coil, allows the detection of the intention of the user with regards to locking or unlocking to be validated.

However, incorporating a device for communication by NFC and an inductive pressure detection sensor within one and the same vehicle door handle has several drawbacks. The first drawback lies in the positioning of the two devices: the coil of the inductive sensor and the coil of the NFC sensor must not be located facing one another since they interfere with one another. Specifically, any metal part located close to the NFC antenna, for example the target or the coil of the inductive sensor, absorbs a portion of the electromagnetic field emitted by said NFC antenna and affects detection and communication with the portable device. Stacking the two devices in the handle is therefore not conceivable, so they must be located beside one another. However, since the space in handles is increasingly restricted (with a view to the esthetics of the handle), mechanically incorporating the components side by side is not always possible due to a lack of space.

SUMMARY OF THE INVENTION

An aspect of the invention proposes a method for activating a function of a vehicle, in this instance the unlocking and/or the locking of a vehicle door, allowing the drawbacks of the prior art to be overcome. More particularly, an aspect of the invention proposes a device for communication by NFC and a pressure detection device using an inductive sensor allowing the two devices to be in proximity to one another and allowing space to be gained with respect to the prior art.

An aspect of the invention proposes an activation module, intended to be fitted to a motor vehicle for the purpose of activating a function of the vehicle from a portable access device carried by a user, the activation module comprising:
a single coil;
first control means for a device for detecting pressure from the hand of the user;
second control means for a near-field communication device having a communication frequency that is capable of communicating with the portable access device;
selection means, connected to the single coil, having two positions:
  a first position in which the selection means connect said single coil to the first control means and disconnect the single coil from the second control means in order to constitute the pressure detection device;
  a second position in which the selection means connect said single coil to the second control means and disconnect the single coil from the first control means in order to constitute the near-field communication device;
a target having a void, said target being located facing the single coil and capable of moving with respect to the single coil;
impedance-adjusting means that are connected to the target;
control means for the selection means.
Judiciously, the adjusting means are suitable for:
adjusting the impedance to below a minimum threshold when the selection means are in the first position; and
adjusting the impedance to above a maximum threshold when the selection means are in the second position.

The first control means comprise means for oscillating the single coil at a resonant frequency, means for measuring an actual frequency of oscillation of said single coil and means for comparing said actual frequency with a first predetermined threshold.

The second control means comprise impedance adjusting means, means for measuring the voltage across the terminals of the single coil, means for comparing said voltage with a second threshold value and means for transmitting/receiving data by near-field communication.

Advantageously, the target takes the shape of an open ring, and the single coil is rectangular in shape.

The target is made of an amagnetic and conductive material, and preferably the dimensions of the void are at least substantially equal to the dimensions of the single coil.

An aspect of the invention also relates to a method for activating a function of a vehicle from a portable access device carried by user, said vehicle comprising at least one activation function, according to any one of the features given above, comprising:
placing the selection means in the first position in order to detect the pressure from the hand of the user; and
placing the selection means in the second position in order to authenticate the portable access device by near-field communication,
valid identification of the portable access device and detection of the pressure from the hand triggering the activation of the function of the vehicle.

According to an aspect of the invention, when the selection means are in the second position, the near-field communication is preceded by a phase of detecting the approach of the portable access device.

Then, when the selection means are in the first position, the detection of pressure from the hand is determined by an increase in the resonant frequency of the single coil.

An aspect of the invention also applies to any deployable door handle comprising two parts, a first, movable part capable of being deployed and a second, fixed part comprised within the door, comprising an activation module according to any one of the features given below.

An aspect of the invention applies more generally to any door handle comprising an activation module according to any one of the features given below.

BRIEF DESCRIPTION OF THE DRAWINGS

Other aims, features and advantages of aspects of the invention will become apparent on reading the following description, by way of nonlimiting example, and on examining the appended drawings, in which.

DETAILED DESCRIPTION OF THE PREFERRED EMBODIMENTS

Figure 1:
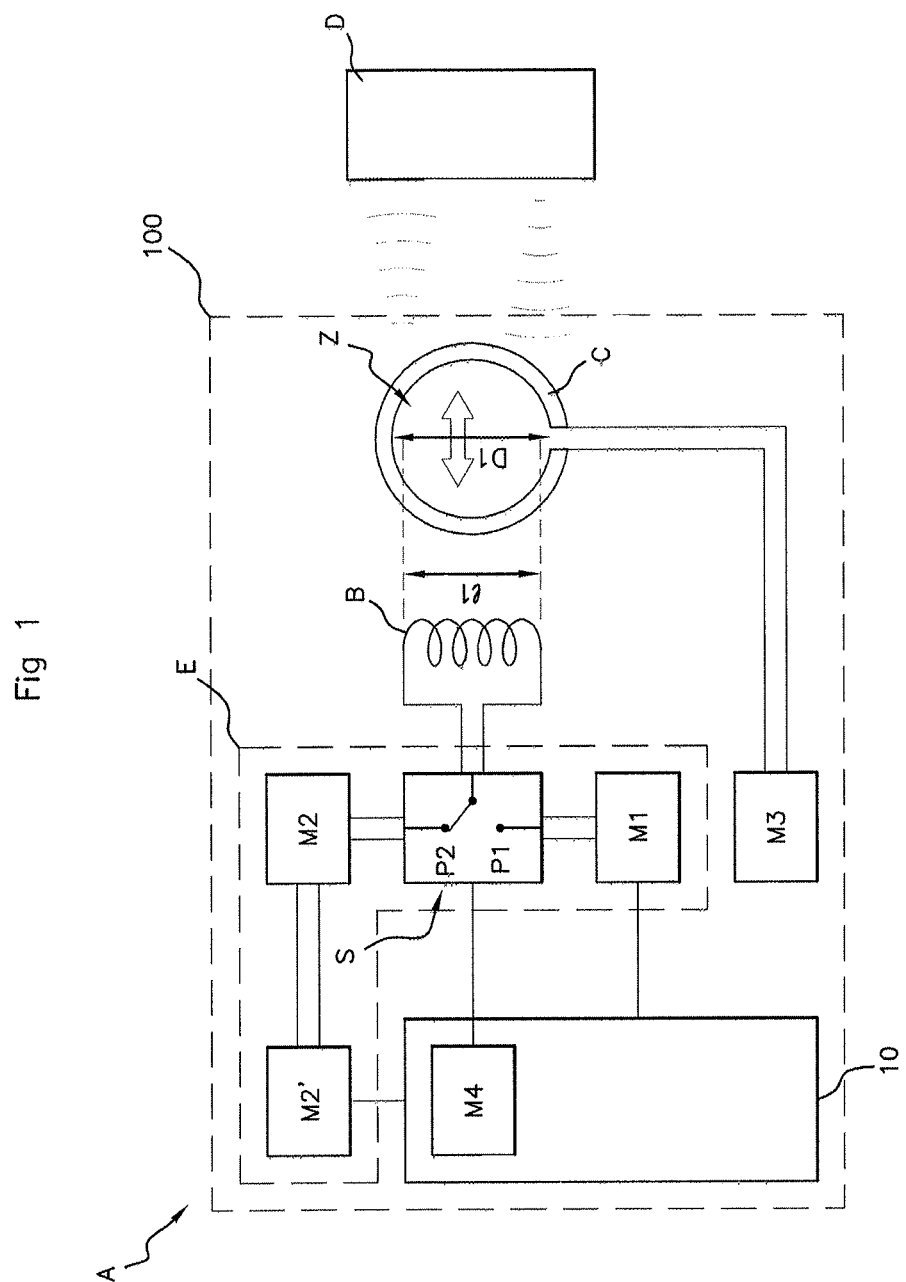
FIG. 1 shows a schematic view of an activation module A according to an aspect of the invention.

The activation module A according to an aspect of the invention is illustrated in FIG. 1. The activation module A is intended to be fitted to a motor vehicle. More particularly, the activation module A is incorporated within a motor vehicle V door P handle 100 (cf. FIG. 3) and makes it possible to activate a function of the vehicle, for example the locking and the unlocking of the doors of the vehicle V. To this end, the activation module A comprises a device for detecting pressure from the hand of the user and a near-field communication (NFC) device for communicating with the portable access device D (badge, phone, etc.) carried by the user. Of course, this example is in no way limiting, and an aspect of the invention is also applicable to any communication by coupling, for example by radiofrequency identification (RFID), at a frequency of around 13.56 MHz.

The valid authentication of the portable access device D in proximity to the handle 100, by near-field communication, and the detection of pressure from the hand M of the user on the handle 100 afterwards (or at the same time), triggers the activation of a function of the vehicle, in this case for example the unlocking of the door P.

The device for detecting pressure from the hand comprises an inductive sensor comprising a coil B and a target C that are located facing one another, as well as first control means M1 for said sensor. The target C is capable of moving toward the coil B when the hand of the user makes contact with the handle 100.

The first control means M1 adjust the frequency $F_B$ of the coil B to a predetermined resonant frequency $F_R$, for example 5 MHz, and excite the coil B at said resonant frequency $F_R$. The first control means M1 measure, in response, the actual excitation frequency $F_B$ of the coil B, which is dependent on the movement of the target C toward the coil B. If the actual excitation frequency $F_B$ of the coil B exceeds the resonant frequency $F_R$, and, more specifically, if the value of the actual excitation frequency $F_B$ exceeds a first threshold value Fs, then valid detection of pressure from the hand of the user on the handle 100 occurs. The first control means M1 comprise, in a manner known per se, a capacitor, a frequency oscillator and means for measuring the frequency of the coil B. This is known to those skilled in the art and will not be described in greater detail here.

The near-field communication device itself comprises a near-field communication antenna and second control means M2, M2' for the communication device.

The second control means M2, M2' consist of means M2 for matching the impedance of the antenna to the near-field communication frequency $F_{NFC}$, i.e. 13.56 MHz, then of means for detecting the approach of a compatible portable access device D and means M2' for near-field transmitting/receiving of data.

The means for detecting the approach of a portable access device D consist for example of means for measuring a voltage across the terminals of the antenna or a phase shift in the current at the terminals of the antenna.

A variation in said voltage above or below a threshold signifies the approach of a compatible portable access device D with which near-field communication is desired.

This is known to those skilled in the art and will not be described in more detail here.

The first control means M1 and the second control means M2, M2' may be comprised within a microcontroller 10 incorporated within a printed circuit board 20. However, in the example illustrated in FIG. 1, said means M1, M2, M2' are components external to the microcontroller 10.

However, unlike the prior art, in which the two devices were independent and preferably located side by side in order to avoid interference, an aspect of the invention proposes here a detection module A in which the pressure detection device and the communication device are not only located facing one another but also share common components, in this instance the coil B.

More particularly, and according to an aspect of the invention, the activation module A comprises a single coil B (cf. FIG. 1) suitable for, alternatively, constituting either the coil B of the inductive sensor of the pressure detection device or the near-field communication antenna of the near-field communication device.

According to an aspect of the invention and to this end, said single coil B is connected to selection means S, for example to a switch S.

The selection means S have two positions, namely a first position P1 and a second edition P2:
  a first position P1 in which the single coil B is electrically connected to the first control means M1 for the pressure detection device and is disconnected from the second control means M2, M2' for near-field communication;
  a second position P2 in which the single coil B is electrically connected to the second control means M2, M2' for near-field communication and is disconnected from the first control means M1 for the pressure detection device.

The single coil B consists of a copper wire winding, for example printed onto a printed circuit board 20 (cf. FIGS. 3A and 3B), and is for example rectangular or circular in shape. Of course, an aspect of the invention is applicable to any shape of single coil B.

The selection means S are controlled for example by control means M4 of a microcontroller 10 which are incorporated within a printed circuit board 20, which is itself located in the handle 100.

The means for controlling the selection means M4 are for example software means.

According to an aspect of the invention, the activation module A also comprises a target C, located facing the single coil B and capable of moving with respect to the single coil B.

According to an aspect of the invention, the target C is located in proximity and is rigidly connected to an outer surface S1 of the handle 100, to which the hand M of the user will apply pressure in order to unlock for example the door P of their vehicle.

The term "rigidly connected" is understood to mean that any pressure on the outer surface S1 of the handle 100 causing a local deformation of said handle 100 results in the target C moving toward the single coil B.

The deformation of the handle 100 caused by the pressure from the user on the outer surface S1 results in the target C moving toward the single coil B.

Figure 3A:
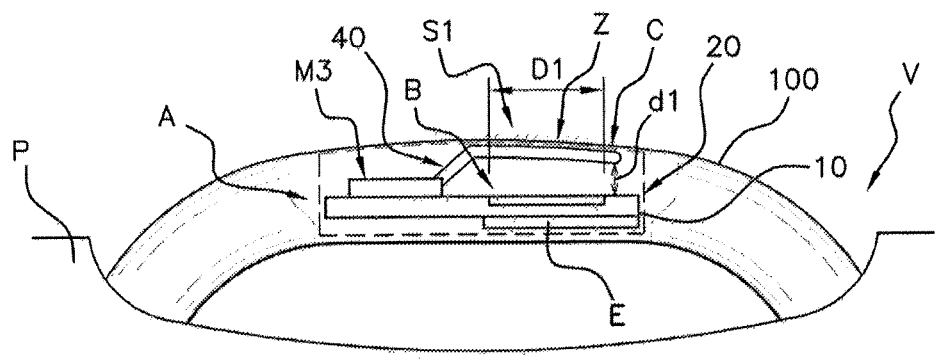
FIGS. 3A and 3B show a schematic view of the activation module A incorporated within the door P handle 100, with FIG. 3A illustrating the position of the target C at rest, i.e. when the hand M of the user is not applying pressure to the handle 109, and with FIG. 3B illustrating the movement of the target C with respect to the coil B when the hand M of the user applies pressure to the handle 100.
Figure 3B:
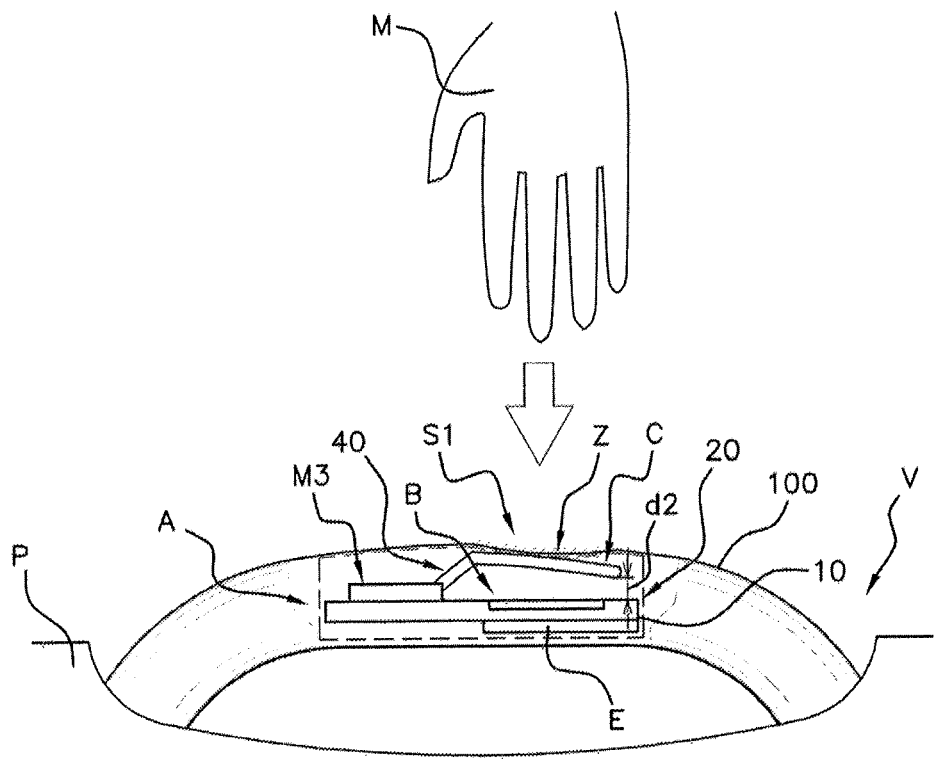

This is illustrated in FIGS. 3A and 3B. In FIG. 3A, the handle 100 is at rest and a distance d1 separates the target C, which is at rest itself, from the single coil B.

In FIG. 3B, the hand M of the user applies pressure to the outer surface S1, resulting in a local deformation of the outer surface S1 of the handle 100 and the movement of the target C toward the single coil B, shortening the distance d1 between the target C and the single coil B to a new distance d2. The movement of the target C toward the single coil B results in an increase in the actual excitation frequency $F_B$ of the single coil B, measured by the first control means M1, which allows pressure from the hand M to be detected, as described in detail below.

Said target C is a "hollow" target, i.e. having a void Z (cf. FIG. 1) without material in its center.

The target C is for example rectangular, ovoid or round in shape, and takes the shape of an open, rigid loop or of a ring having an inner edge, delimiting the void Z, and an outer edge. Said target C is preferably, but nonlimitingly, located in a plan that is parallel to the plane defined by the single coil B.

Said target C consists of an amagnetic conductive material, for example of aluminum.

The dimensions of the target C are preferably substantially equal to the dimensions of the single coil B. More specifically, in the case of the target C being round in shape, and the single coil B being rectangular in shape, as illustrated in FIG. 1, the diameter D1 of the inner edge of the target C (or the diameter D1 of the void Z) is preferably, but not exclusively, greater than or at least equal to the length l1 of the coil B, such that this void Z allows the electromagnetic waves emitted by the single coil B, when said single coil B is in near-field communication with the portable access device D, to pass through, which is described in detail below.

Preferably, the single coil B and the target C are centered with respect to one another and each is symmetrical in shape along at least one of two perpendicular axes intersecting at their respective centers.

The target C is connected by its ends to impedance-adjusting means M3.

Figure 2:
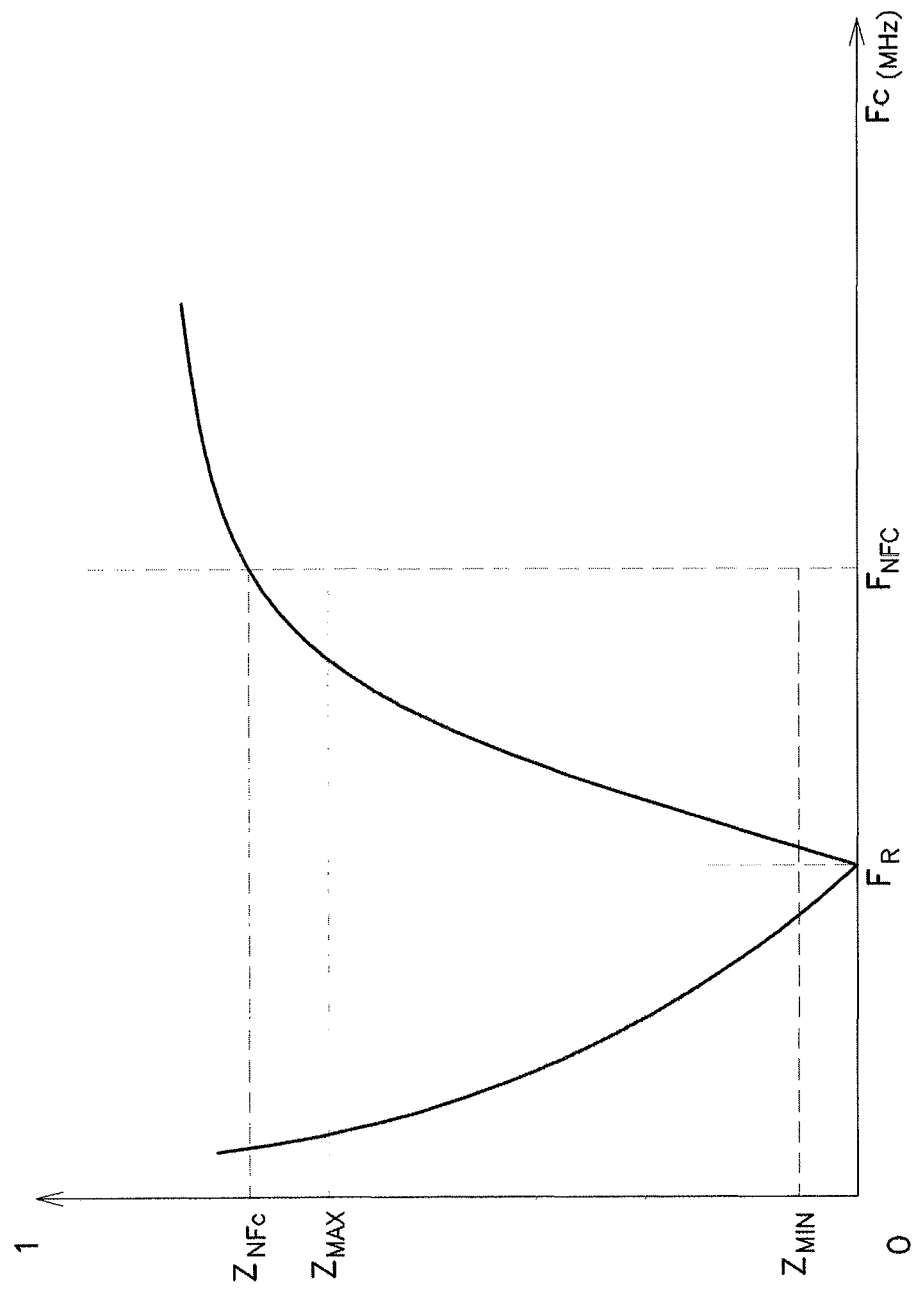
FIG. 2 is a graph illustrating the impedance value of the target according to an aspect of the invention at two predetermined frequencies, a resonant frequency $F_R$ for pressure detection and at a communication frequency $F_{NFC}$ for the near-field communication with the portable access device D.

The adjusting means M3 consist for example of an LC circuit, i.e. a circuit comprising a coil and a capacitor connected in series so as to form a circuit resonating at a resonant frequency $F_R$, i.e. a circuit whose impedance Z is minimum at the resonant frequency $F_R$. The adjusting means M3 are tuned so that the impedance Z of the circuit consisting of the adjusting means M3 and of the target C is:

at minimum, or, more specifically, below a threshold Zmin, for example 10Ω (cf. FIG. 2) at the resonant frequency $F_R$ of the single coil B;

at maximum, or, more specifically, above a threshold Zmax, for example 500Ω (cf. FIG. 2) at the near-field communication frequency $F_{NFC}$.

Thus, at the resonant frequency $F_R$, since the impedance of the circuit is low, the electromagnetic waves emitted by the coil B produce a current in the target C, and the movement of the target C closer to the coil B modifies the actual frequency of oscillation of the coil $F_B$.

Conversely, at the near-field communication frequency $F_{NCF}$, since the impedance of the circuit is high, the electromagnetic waves emitted by the single coil B do not produce a current in the target C and are not absorbed by the target C, and they may therefore "pass through" the void Z of the target C.

The adjusting means M3 and the single coil B are preferably located on one and the same printed circuit board, for example the printed circuit board 20, the target C itself being rigidly connected and located in proximity to the outer surface S1 of the handle 100. Said target C is therefore located, when the handle 100 is at rest, at a distance d1 away from the adjusting means M3 and from the printed circuit board 20. The target C is connected to said adjusting means M3 by a conductive link 40, and flexibly, for example in the form of a connecting lug 40 (cf. FIGS. 3A and 3B), so that it is able to move with respect to the single coil B. The connecting lug 40 is capable of bending when the hand M of the user applies pressure to the outer surface S1.

When the selection means S are in the first position P1, then the target C and the single coil B form an inductive sensor that is capable of detecting pressure from the hand M of the user on the handle 100.

However, and judiciously, according to an aspect of the invention, the single coil B is also connected when the selection means S are in the second position P2 allowing data to be transmitted and received by near-field communication via said single coil B. In the second position P2, the single coil B then constitutes a near-field communication antenna.

The void Z at the center of the target C allows, in this second position P2, the electromagnetic waves emitted by the single coil B to pass through and effective near-field communication with the portable access device D to be ensured.

Specifically, if the target C were solid, it would interfere with the electromagnetic waves emitted at the near-field communication frequency $F_{NFC}$. One portion of the electromagnetic waves would be absorbed by the target C with the creation of eddy currents and another portion would be reflected toward the single coil B with opposite phase.

Judiciously, an aspect of the invention proposes a particular shape of target C that does not prevent near-field communication between the single coil B and the portable access device D when the selection means S are in the second position P2 and the single coil B is operating as a communication antenna. Moreover, the circuit consisting of the adjusting means M3 and of the target C has, at said communication frequency $F_{NFC}$, a matched impedance Z (i.e. a very high impedance, as explained above) so as to contribute to the electromagnetic waves passing through the void Z of the target C.

The selection means S therefore make it possible:

when they are in the first position P1: to adjust the frequency of the single coil $F_B$ to the resonant frequency $F_R$ (5 MHz for example) and thus to activate the pressure detection device;

when they are in the second position P2, to adjust the impedance of the single coil $F_B$ and to connect said single coil B to the circuit for transmitting/receiving data at the near-field communication frequency $F_{NFC}$ (13.56 MHz), and thus to activate the near-field communication device.

Judiciously, the target C is suitable:

when the selection means S are in the first position P1: for acting as an inductive sensor target C, the value of the impedance Z of the circuit consisting of the target C and of the adjusting means M3 being low;

when the selection means S are in the second position P2: for allowing the electromagnetic waves transmitted by the single coil B to the portable access device D to pass through its void Z, when said coil emits at the near-field communication frequency the value of the impedance Z of the circuit consisting of the target C and of the adjusting means M3 being high.

Figure 4:
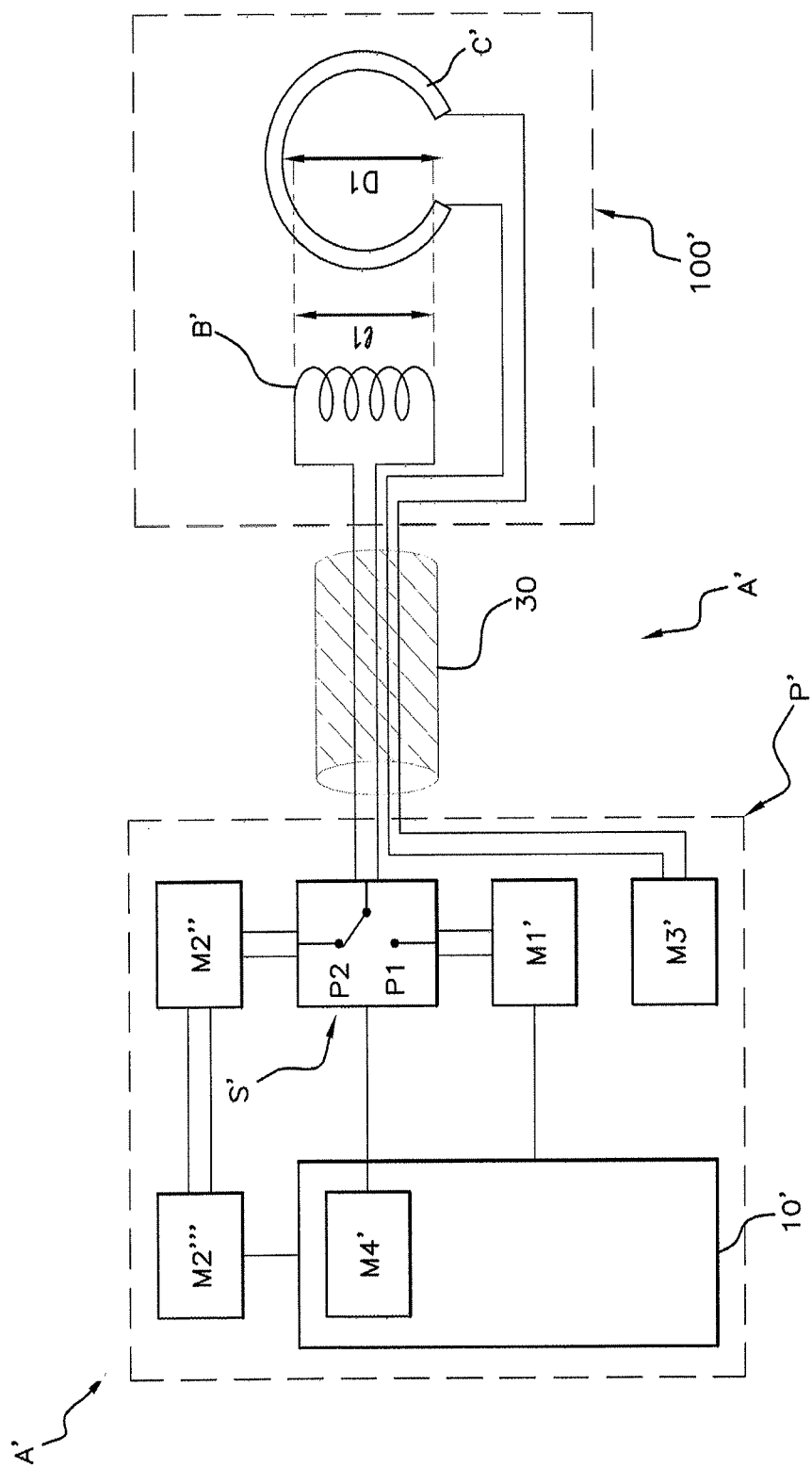
FIG. 4 shows a schematic view of another embodiment of the activation module A', more specifically when it is incorporated within a deployable handle 100'.

Another embodiment of the activation module A according to an aspect of the invention is illustrated in FIG. 4. FIG. 4 illustrates a deployable handle 100' which is in a rest position and incorporated within the door P', such that the handle 100' does not protrude with respect to the surface of the door P', and in an active position in which it is deployed by a motorized mechanism and articulated arms, and protrudes out of the door P so that the hand M of the user is able to grasp it.

In this embodiment, a movable part 300 of the handle 100' comprises the single coil B' and the target C', and a fixed part 400, incorporated within the door P', comprises the selection means S', the control means M4' for the selection means, the first control means M1', the second control means M2", M2''', the frequency-adjusting means M3' and a microcontroller 10'.

The movable part 300 of the handle 100' is connected for example to the fixed part 400 by a flexible coaxial cable 30.

Figure 5:
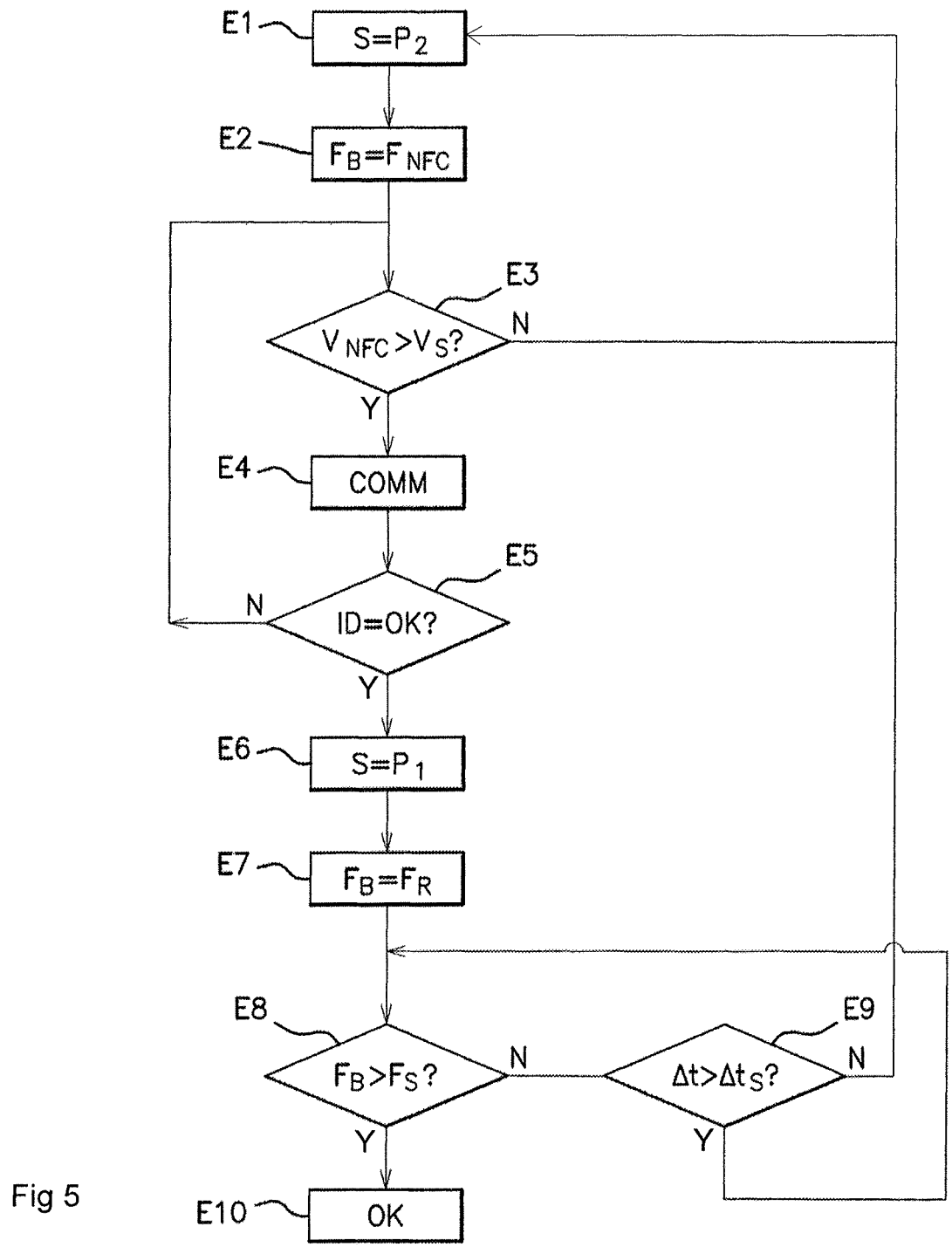
FIG. 5 is a flowchart showing the steps of the method for activating a vehicle function according to an aspect of the invention.

An aspect of the invention also proposes a first embodiment of the method for activating a function of the vehicle, illustrated in FIG. 5 and described below.

In a first step (E1) the selection means S are in the second position P2 and the single coil B constitutes the near-field communication antenna, i.e. $F_B=F_{NFC}$ (step E2).

If the voltage across the terminals of the single coil B passes above or below a predetermined threshold, if $V_{NFC}>V_S$, (step E3) then detection of the presence of a compatible portable access device D occurs and near-field communication is triggered (step E4), otherwise the method returns to step E1. This detection may also be achieved by a phase shift at the terminals of the single coil B being detected. This is known to those skilled in the art.

An identifier exchange takes place (step E5) between the activation module A and the portable access device D; if the portable access device D is authenticated then the selection means S switch to the first position P1 (step E6).

The frequency of oscillation of the single coil B is then equal to the resonant frequency $F_B=F_R$ (step E7).

If the actual measured frequency of oscillation $F_B$ of the single coil B becomes higher than the resonant frequency $F_R$ (step E8) and, more particularly, if the actual frequency of oscillation of the single coil $F_B$ becomes higher than a second predetermined threshold $F_s$, then detection of the movement of the hand M of the user toward the handle occurs and the intention to unlock the vehicle is validated (step E10).

Otherwise, if the actual frequency of oscillation of the single coil $F_B$ remains below a second predetermined threshold $F_S$ for a duration $\Delta t$ longer than a predetermined duration $\Delta t_S$, then detection of the movement of the hand M of the user toward the handle 100 does not occur (step E9), the intention to unlock the vehicle is not validated and the method returns to step E1.

In a second embodiment of the activation method, steps E1 to E5 are carried out after steps E6 to E9. In this second embodiment, the selection means S are initially in the first position P1 in order to detect the pressure from the hand M of the user on the handle 100, then, once pressure has been detected, the selection means S switch to the second position P2 in order to trigger presence detection, then communication and an identifier exchange with the portable access device D.

Lastly, in a third embodiment of the activation method according to an aspect of the invention, the selection means S alternate between the first position P1 and the second edition P2 at a set frequency. In other words, the activation module A operates alternately as a pressure detection device and as a communication device.

Any valid detection in either of the two positions of the selection means S, whether pressure detection (in the first position P1) or approach detection by NFC (in the second position P2) triggers the selection means S to switch to the other of the two positions, i.e. to the second position P2 in order to detect the approach of a portable access device D or to the first position P1 in order to detect pressure from the hand of the user on the handle 100, respectively.

Authentication of the portable access device D and detection of hand contact with the handle, whether preceding or following authentication, trigger the activation of a function of the vehicle.

An aspect of the invention is based on the use of a coil acting both as a coil of the inductive sensor and as a near-field communication antenna via the addition of a selection means and by specifically modifying the target of the inductive sensor, which is located facing the coil, so as not to interfere with the near-field communication.

An aspect of the invention judiciously makes it possible to incorporate, within a vehicle door handle, a pressure detection device, using an inductive sensor, and a near-field communication device while avoiding interference between the two devices and affording a substantial space saving with respect to the prior art.

The invention claimed is:

1. An activation module, intended to be fitted to a motor vehicle for the purpose of activating a function of the vehicle from a portable access device carried by a user, the activation module comprising:
   a single coil;
   a first controller for a device for detecting pressure from a hand of the user;
   a second controller for a near-field communication device having a communication frequency that is capable of communicating with the portable access device;
   a selector, connected to the single coil, having two positions:
      a first position in which the selector connects said single coil to the first controller and disconnects the single coil from the second controller in order to constitute the pressure detection device;
      a second position in which the selector connects said single coil to the second controller and disconnects the single coil from the first controller in order to constitute the near-field communication device;
   a target having a void, said target being located facing the single coil and capable of moving with respect to the single coil;
   an impedance adjuster that is connected to the target;
   a third controller for the selector.

2. The activation module as claimed in claim 1, wherein the adjuster is suitable for:
   adjusting an impedance to below a minimum threshold when the selector is in the first position; and
   adjusting the impedance to above a maximum threshold when the selector is in the second position.

3. The activation module as claimed in claim 2, wherein the first controller comprises means for oscillating the single coil at a resonant frequency, means for measuring an actual frequency of oscillation of said single coil and means for comparing said actual frequency with a first predetermined threshold.

4. The activation module as claimed in claim 1, wherein the first controller comprises means for oscillating the single coil at a resonant frequency, means for measuring an actual frequency of oscillation of said single coil and means for comparing said actual frequency with a first predetermined threshold.

5. The activation module as claimed in claim 1, wherein the second controller comprises impedance-adjusting means, means for measuring the voltage across the terminals of the single coil, means for comparing said voltage with a second threshold value and means for transmitting/receiving data by near-field communication.

6. The activation module as claimed in claim 1, wherein the target takes the shape of an open ring, and the single coil is rectangular in shape.

7. The activation module as claimed in claim 1, wherein the target is made of an amagnetic and conductive material, and the dimensions of the void are at least substantially equal to the dimensions of the single coil.

8. A method for activating a function of a vehicle from a portable access device carried by user, said vehicle comprising at least one activation module as claimed in claim 1, comprising:

placing the selector in the first position in order to detect the pressure from the hand of the user; and placing the selector in the second position in order to authenticate the portable access device by near-field communication, valid identification of the portable access device and detection of the pressure from the hand triggering the activation of the function of the vehicle.

9. The activation method as claimed in claim 8, wherein, when the selector is in the second position, the near-field communication is preceded by a phase of detecting an approach of the portable access device.

10. The activation method as claimed in claim 9, wherein, when the selector is in the first position, the detection of pressure from the hand is determined by an increase in the resonant frequency of the single coil.

11. The activation method as claimed in claim 8, wherein, when the selector is in the first position, the detection of pressure from the hand is determined by an increase in the resonant frequency of the single coil.

12. A deployable door handle comprising two parts, a first, movable part capable of being deployed and a second, fixed part comprised within the door, and comprising an activation module as claimed in claim 1.

13. A door handle, comprising an activation module as claimed in claim 1.

* * * * *